(12) United States Patent
Lenski et al.

(10) Patent No.: US 7,316,975 B2
(45) Date of Patent: Jan. 8, 2008

(54) METHOD OF FORMING SIDEWALL SPACERS

(75) Inventors: Markus Lenski, Dresden (DE);
Wolfgang Buchholtz, Radebeul (DE);
Andy Wei, Dresden (DE); Michael Raab, Radebeul (DE)

(73) Assignee: Advanced Micro Devices, Inc., Austin, TX (US)

( * ) Notice: Subject to any disclaimer, the term of this patent is extended or adjusted under 35 U.S.C. 154(b) by 40 days.

(21) Appl. No.: 11/177,216

(22) Filed: Jul. 8, 2005

(65) Prior Publication Data

US 2006/0115988 A1  Jun. 1, 2006

(30) Foreign Application Priority Data

Nov. 30, 2004  (DE) .................. 10 2004 057 809

(51) Int. Cl.
*H01L 21/302* (2006.01)
*H01L 21/461* (2006.01)

(52) U.S. Cl. ........................... 438/689; 438/706
(58) Field of Classification Search ................ 438/689
See application file for complete search history.

(56) References Cited

U.S. PATENT DOCUMENTS

| | | | |
|---|---|---|---|
| 4,839,311 A * | 6/1989 | Riley et al. ............ | 438/14 |
| 6,187,620 B1 | 2/2001 | Fulford, Jr. et al. ........ | 438/230 |
| 6,696,334 B1 | 2/2004 | Hellig et al. ................ | 438/230 |
| 2004/0188769 A1* | 9/2004 | Tsuno .......................... | 257/371 |
| 2005/0051866 A1* | 3/2005 | Wang et al. ................ | 257/510 |
| 2005/0106890 A1* | 5/2005 | Schroeder et al. .......... | 438/719 |

FOREIGN PATENT DOCUMENTS

DE    196 54 738 A1    7/1997

* cited by examiner

*Primary Examiner*—Nadine G. Norton
*Assistant Examiner*—Mahmoud Dahimene
(74) *Attorney, Agent, or Firm*—Williams, Morgan & Amerson, P.C.

(57) ABSTRACT

A substrate comprising a first transistor element and a second transistor element is provided. A layer of a material is deposited over the first transistor element and the second transistor element. A portion of the layer of material is modified, which may be done, e.g., by irradiating the portion with ions or performing an isotropic etching process to reduce its thickness. An etching process adapted to remove the modified portion of the layer of material more quickly than an unmodified portion of the layer located over the second transistor element is performed.

18 Claims, 5 Drawing Sheets

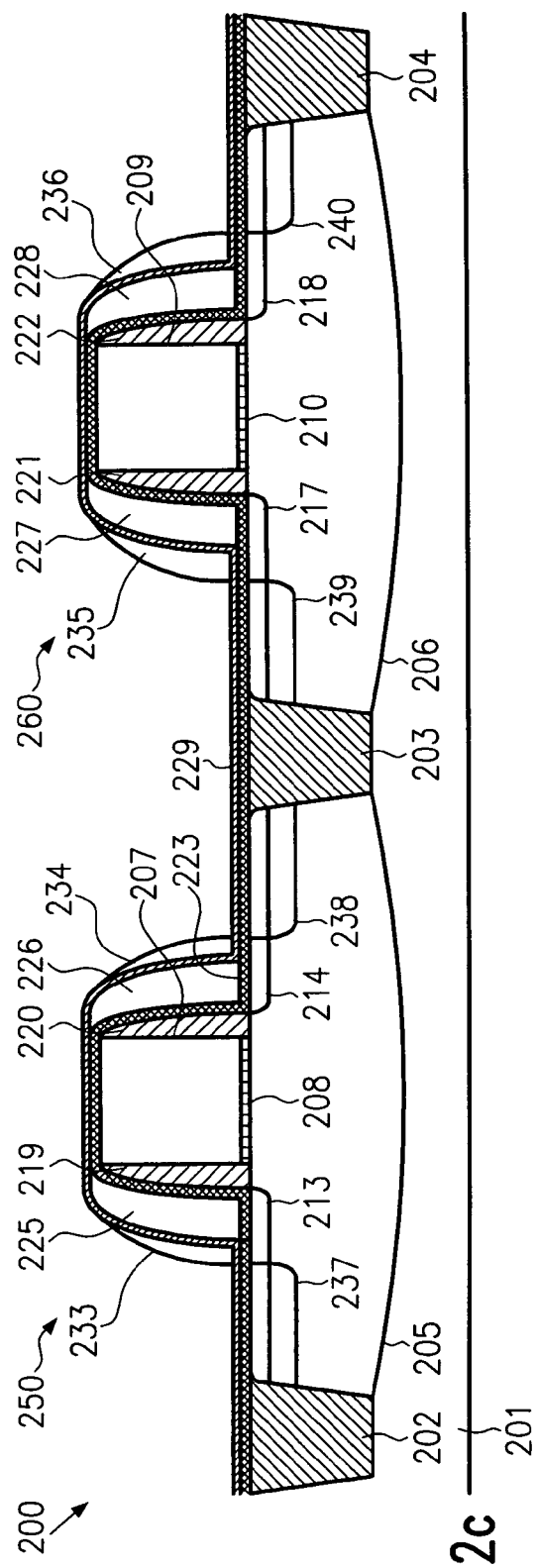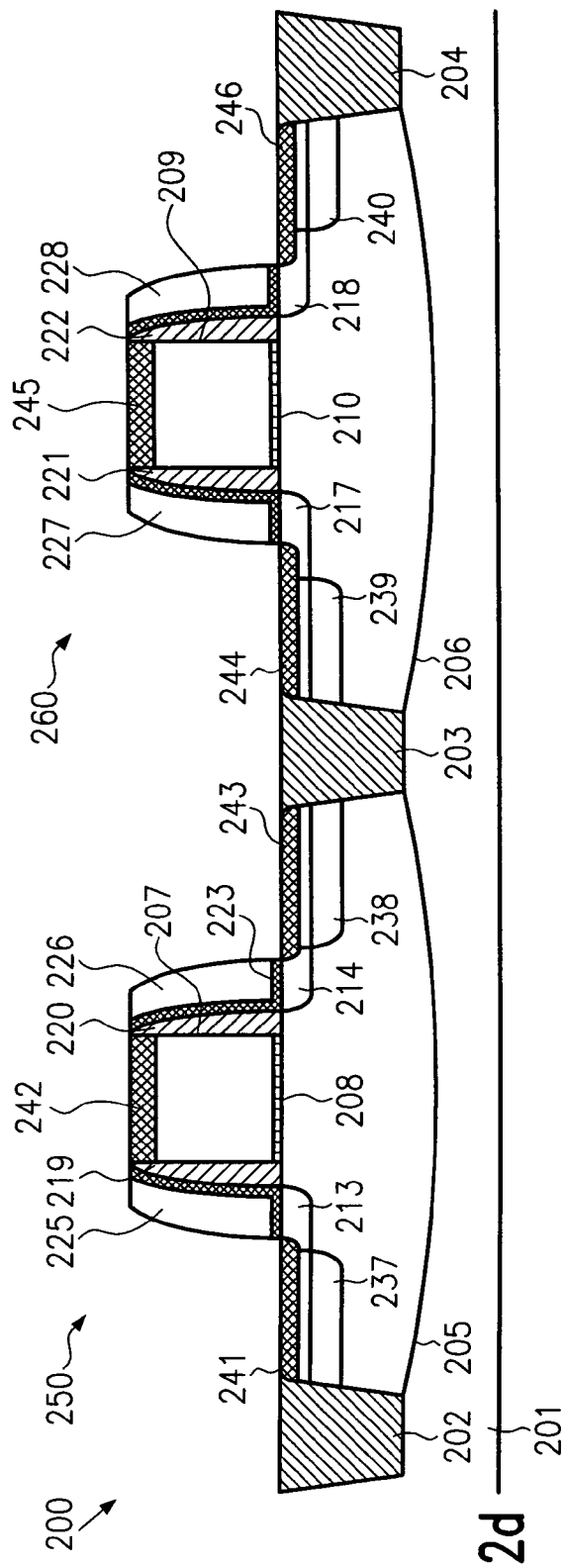

METHOD OF FORMING SIDEWALL SPACERS

BACKGROUND OF THE INVENTION

1. Field of the Invention

The present invention relates to the formation of integrated circuits, and, more particularly, to the formation of sidewall spacers in field effect transistors.

2. Description of the Related Art

Integrated circuits comprise a large number of individual circuit elements such as, e.g., transistors, capacitors and resistors. These elements are connected internally to form complex circuits such as memory devices, logic devices and microprocessors. The performance of integrated circuits can be improved by increasing the number of functional elements per circuit in order to increase their functionality and/or by increasing the speed of operation of the circuit elements. A reduction of feature sizes allows the formation of a greater number of circuit elements on the same area, hence allowing an extension of the functionality of the circuit, and also reduces signal propagation delays, thus making an increase of the speed of operation of circuit elements possible.

Field effect transistors are used as switching elements in integrated circuits. They allow control of a current flowing through a channel region located between a source and a drain. The source and the drain are highly doped. In N-type transistors, the source and the drain are doped with an N-type dopant. Conversely, in P-type transistors, the source and the drain are doped with a P-type dopant. The doping of the channel region is inverse to the doping of the source and the drain. The conductivity of the channel region is controlled by a gate voltage applied to a gate electrode formed above the channel region and separated there-from by a thin insulating layer. Depending on the gate voltage, the channel region may be switched between a conductive "on" state and a substantially non-conductive "off" state.

Reducing the size of a field effect transistor may entail a reduction of the distance between the source and the drain, which is commonly denoted as "channel length." A reduction of the channel length entails a plurality of issues associated therewith. First, advanced techniques of photolithography and etching have to be provided in order to reliably and reproducibly create transistors having short channel lengths. Moreover, highly sophisticated dopant profiles, in the vertical direction as well as in the lateral direction, are required in the source and in the drain in order to provide a low sheet resistivity and a low contact resistivity in combination with a desired channel controllability.

When the integrated circuit is exposed to elevated temperature in stages of the manufacturing process after the formation of the source and the drain, P-type dopants and N-type dopants may diffuse at different speed. For example, boron which is used as a P-type dopant diffuses more quickly than the frequently used N-type dopant arsenic. Due to dopant diffusion, an initially provided dopant profile can be blurred. In order to at least partially compensate for the effects of dopant diffusion, different dopant profiles may be provided in N-type transistors and P-type transistors.

A method of forming a semiconductor structure 100 according to the state of the art will now be described with reference to FIGS. 1a-1c. A substrate 101 is provided. In the substrate 101, shallow trench isolations 102, 103, 104 and active regions 105, 106 of a first transistor element 150 and a second transistor element 160 are formed. Then, gate electrodes 107 and 109 which are separated from the substrate 101 by gate insulation layers 108 and 110, respectively, are formed over the substrate 101. This can be done by means of known advanced techniques of ion implantation, oxidation, deposition and photolithography.

Then, offset spacers 119, 120 are formed adjacent the gate electrode 107 of the first transistor element 150. Adjacent the gate electrode 109 of the second transistor element 160, offset spacers 121, 122 are formed. The formation of the offset spacers 119-122 may be performed by means of known methods comprising a conformal deposition of a layer of a material and an anisotropic etching of the layer. Subsequently, one or more extension implant processes are performed to form extended source regions 113, 117, and extended drain regions 114, 118 are formed at the gate electrodes 107, 109, adjacent the offset spacers 119, 120, 121, 122. This may be done by means of ion implantation.

The first transistor element 150 is an N-type transistor, and the second transistor element 160 is a P-type transistor. In each of the ion implantation processes performed in the formation of the active regions 105, 106 and the extended source and drain regions, one of the transistor elements 150, 160 is covered by a first mask. Then, the semiconductor structure 100 is irradiated with ions of a first dopant. Subsequently, the first mask is removed, the other transistor element is covered by a second mask and the semiconductor structure 100 is irradiated with ions of a second dopant. Thus, a P-type dopant may be introduced into the active region 105 of the first transistor element 150 and the extended source and drain regions of the second transistor element 160, and an N-type dopant can be introduced into the active region 106 of the second transistor element 160 and the extended source and drain regions of the first transistor element 150.

A first liner layer 123 is deposited on the semiconductor structure 100. Then, inner sidewall spacers 125, 126 are formed at the gate electrode 107 of the first transistor element 150. Similarly, inner sidewall spacers 127, 128 are formed at the gate electrode 109 of the second transistor element. Subsequently, a second liner layer 129 is deposited over the substrate 101 and outer sidewall spacers 130, 131, 132, 133 are formed at the gate electrodes 107, 109. The inner and the outer sidewall spacers may be formed by means of known methods comprising a conformal deposition of a material layer over the semiconductor structure 100 and an anisotropic etching of the material layer.

The liner layers 123, 129 are formed of a material having a significantly lower etch rate than the material of the inner sidewall spacers 125-128 and the outer sidewall spacers 130-133 when exposed to the etchant used in the etching processes applied in the formation of the sidewall spacers. Hence, the liner layers 123, 129 function as etch stop layers. In the formation of the inner sidewall spacers 125-128, the first liner layer 123 protects the subjacent portions of the semiconductor structure 100 from being affected by the etchant. In the formation of the outer sidewall spacers, the second liner layer 129 protects the portions of the semiconductor structure 100 located thereunder. The liner layers 123, 129, however, are affected by the etchants. Therefore, a thickness of the first liner layer 123 and the second liner layer 129 is reduced in the formation of the inner sidewall spacers 125-128 and the outer sidewall spacers 130-133, respectively.

A further stage of the manufacturing process is shown in FIG. 1b. The outer sidewall spacers 130, 131 of the first transistor element 150 are removed. This can be done by covering the second transistor element 160 by a mask (not shown) and exposing the semiconductor structure 100 to an etchant adapted to selectively remove a material of the outer sidewall spacers 130, 131. In this etching process, the second liner layer 129 is used as an etch stop layer. Since, however, the second liner layer 129 has already been affected by the etchant used in the formation of the outer sidewall spacers 130-133, the second liner layer 129 may be insufficient to protect the semiconductor structure 100. Hence, the etchant may affect the active region 105 and the gate electrode 107, which can lead to the formation of pits 134, 135, 136.

Yet another stage of the manufacturing process is shown in FIG. 1c. In the first transistor element 150, a source region 143 and a drain region 144 are formed. This may be done by implanting ions of an N-type dopant into the active region 105. A mask (not shown) is formed to protect the second transistor element 160 from an irradiation with ions. In the ion implantation, the offset spacers 119, 120 and the inner sidewall spacers 125, 126 protect subjacent portions of the active regions 105, 106 from being irradiated with ions. Therefore, the source region 143 and the drain region 144 are spaced apart from the gate electrode 107 by a distance which is determined by the thickness of the offset spacers 119, 120 and the inner sidewall spacers 125, 126. The source region 143 and the extended source region 113 together form a source of the first transistor element 150. A drain of the first transistor element 150 is provided by the drain region 144 and the extended drain region 114.

A further ion implantation is performed to form a source region 145 and a drain region 146 in the second transistor element 160. To prevent an irradiation of the first transistor element 150 with ions, a mask is formed over the first transistor element 150. The offset spacers 121, 122, the inner sidewall spacers 127, 128 and the outer sidewall spacers 132, 133 absorb ions impinging on the semiconductor structure 100. Thus, the source region 145 and the drain region 146 are spaced apart from the gate electrode 109 by a distance determined by the thickness of the outer sidewall spacers 132, 133 in addition to the thickness of the offset spacers 121, 122 and the inner sidewall spacers 127, 128. Hence, the spacing between the source region 145 and the drain region 146, respectively, and the gate electrode 109 is greater than the spacing between the source region 143 and the drain region 144, respectively, and the gate electrode 107 of the first transistor element 150. The source region 145 and the extended source region 117 together provide a source of the second transistor element. A drain of the second transistor element 160 is formed by the drain region 146 and the extended drain region 118.

If the semiconductor structure 100 is exposed to an elevated temperature in later phases of the manufacturing process, a diffusion of the dopants introduced into the source regions 143, 145 and the drain regions 144, 146 may occur. The P-type dopant in the source region 145 and the drain region 146 of the second transistor element 160 may diffuse more quickly than the N-type dopant in the source region 143 and the drain region 144 of the first transistor element 150. In particular, the P-type dopant may diffuse towards the gate electrode 109. The greater spacing between the source and drain regions and the gate electrode 109 in the second transistor element 160 insures that a sufficient distance between the dopants in the source and drain regions and the channel region below the gate electrode 109 can be maintained in spite of the dopant diffusion.

Finally, after a removal of the first liner layer 123 and the second liner layer 129, silicide regions 137, 138, 139, 140, 141, 142 are formed in the sources, the drains and the gate electrodes 107, 109 of the transistor elements 150, 160 in order to increase the conductivity of these features. As is well known to persons skilled in the art, the silicide regions 137-142 may be formed by depositing a refractory metal layer on the semiconductor structure and performing an annealing in order to initiate a chemical reaction between the refractory metal and the subjacent silicon. Since the offset spacers 119-122, the inner sidewall spacers 125-128 and the outer sidewall spacers 132, 133 prevent a contact between the refractory metal layer and portions of the substrate 101 close to the gate electrodes 107, 109, the silicide regions 137, 139, 140, 142 are spaced apart from the gate electrodes 107, 109.

A problem of the above-described method according to the state of the art is that, in features of the transistor elements 150, 160, an undesirable pitting may occur while the outer sidewall spacers 130, 131 of the first transistor element 150 are removed, as described above. This may impose constraints on yield and reliability of the manufacturing process.

Another problem of the above-described method according to the state of the art is that the spacing between the silicide regions 140, 142 formed adjacent the gate electrode 109 of the second transistor element 160 is greater than the spacing between the silicide regions 137, 139 adjacent the gate electrode 107 of the first transistor element 150. Hence, the electrical resistivity of the source and drain of the second transistor element 160 is greater than the electrical resistivity of the source and drain of the first transistor element 150. This may lead to undesirable signal propagation delays imposing constraints on the speed of operation of the second transistor element 160.

In view of the above problems, a need exists for a method of forming a semiconductor structure allowing the formation of different dopant profiles in transistor elements with reduced constraints on yield, reliability and/or speed of operation of the transistor elements.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

According to an illustrative embodiment of the present invention, a method of forming a semiconductor structure comprises providing a substrate comprised of a first transistor element and a second transistor element. A layer of a material is deposited over the first transistor element and the second transistor element. A first portion of the layer of material located over the first transistor element is modified. An etching process is performed. The etching process is adapted to remove the modified first portion of the layer of material at a greater etch rate than an unmodified second portion of the layer located over the second transistor element.

According to another illustrative embodiment of the present invention, a method of forming a semiconductor structure comprises providing a substrate comprised of a first transistor element and a second transistor element. A layer of a material is deposited over the first transistor element and the second transistor element. A mask is formed over the second transistor element. An isotropic etching process is performed. The isotropic etching process is stopped prior to complete removal of a portion of the layer of material located over the first transistor element. The mask is removed and an anisotropic etching process is performed. The anisotropic etching process is stopped upon substantial removal of portions of the layer of material located over substantially horizontal portions of the second transistor element.

BRIEF DESCRIPTION OF THE DRAWINGS

The invention may be understood by reference to the following description taken in conjunction with the accompanying drawings, in which like reference numerals identify like elements, and in which:

FIGS. 2a-2d show schematic cross-sectional views of a semiconductor structure in stages of a manufacturing process according to an embodiment of the present invention.

Figure 1A:
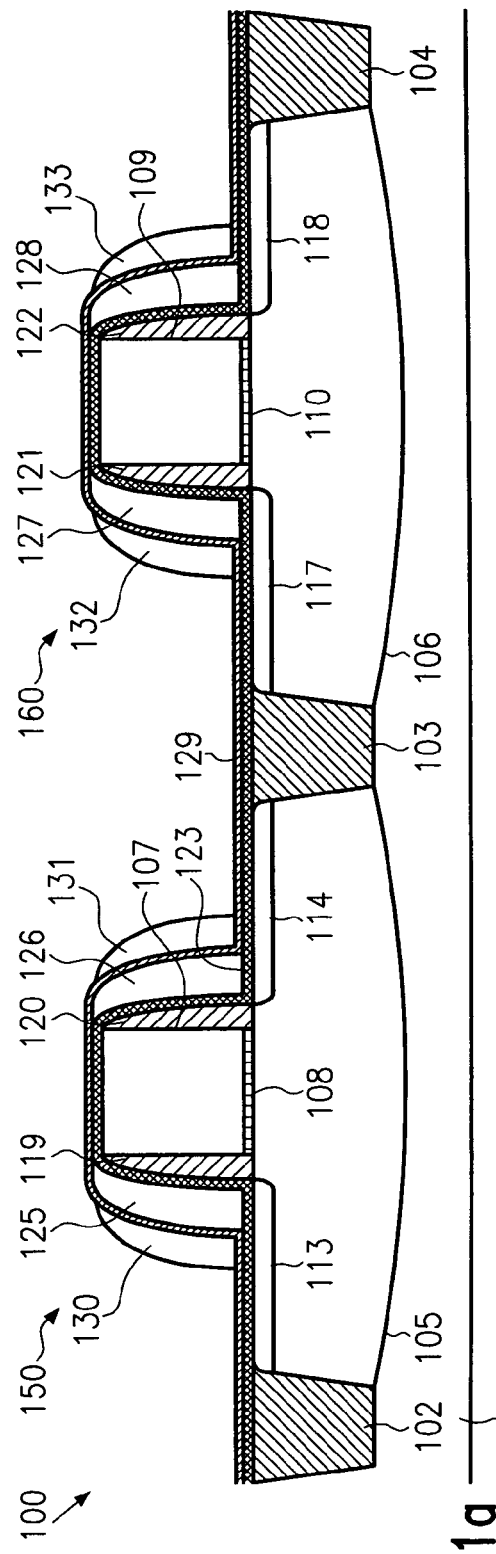
FIGS. 1a-1c show schematic cross-sectional views of a semiconductor structure in stages of a manufacturing process according to the state of the art.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In a method of manufacturing a semiconductor structure according to an embodiment of the present invention, a layer of a material is deposited over a first transistor element and a second transistor element. A first portion of the layer of material located over the first transistor element is modified. A second portion of the layer of material located over the second transistor element remains effectively unmodified.

The modification may be performed by implanting ions into the first portion of the layer of material. In other embodiments of the present invention, the first portion of the layer of material can be modified by performing an isotropic etching process which is stopped prior to a complete removal of the first portion of the material layer.

Subsequently, an anisotropic etching process adapted to remove the modified first portion of the layer of material more quickly than the unmodified second portion can be performed. In case the first portion has been modified by implanting ions, the etching rate of the first portion can be greater than the etching rate of the second portion. In embodiments wherein the modification is performed by isotropically etching the first portion of the material layer, the etching rate of the first portion is about the same as the etching rate of the second portion; since, however, the first portion is thinner than the second portion, less time is required to remove the first portion.

Due to the anisotropy of the etching process, residues of the second portion of the layer of material remain on steep portions of the second transistor element if the etching process is stopped upon a substantial removal of portions of the layer of material located over substantially horizontal portions of the second transistor element. These residues may be used as sidewall spacers. Since the modified first portion of the layer of material is etched more quickly, the etching completely removes the first portion of the layer from the first transistor element, or the remaining residues of the first portion are smaller than the remaining residues of the second portion.

Hence, the present invention allows selectively forming sidewall spacers in the second transistor element. Thereby, the exposure of features under the layer of material, which may, for example, comprise a liner layer, to the etchant is reduced compared to a method according to the state of the art.

Figure 2A:
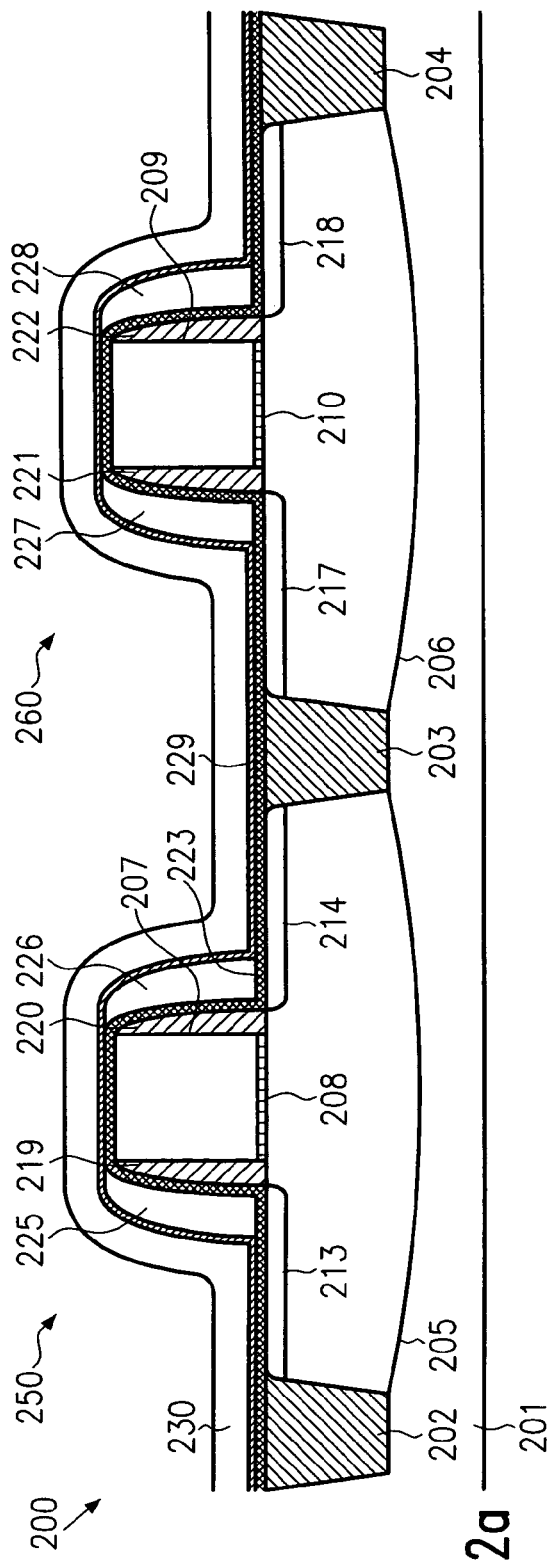

Further illustrative embodiments of the present invention will now be described with reference to FIGS. 2a-2d. FIG. 2a shows a schematic cross-sectional view of a semiconductor structure 200 in a first stage of a manufacturing process according to the present invention. The semiconductor structure 200 comprises a substrate 201. The substrate 201 comprises a first transistor element 250 and a second transistor element 260. Shallow trench isolations 202, 203, 204 separate an active region 205 of the first transistor element 250 and an active region 206 of the second transistor element 260 from each other and from other circuit elements in the semiconductor structure 200.

The first transistor element 250 comprises a gate electrode 207 separated from the active region 205 by a gate insulation layer 208. Adjacent the gate electrode 207, offset spacers 219, 220 are formed. An extended source region 213 and an extended drain region 214 are formed in the active region 205 adjacent the offset spacers 219, 220. Similarly, the second transistor element 260 comprises a gate electrode 209, a gate insulation layer 210, offset spacers 221, 222, an extended source region 217 and an extended drain region 218. A first liner layer 223 is formed over the active regions 205, 206, the gate electrodes 207, 209 and the offset spacers 219-222. The gate electrode 207 of the first transistor element 250 is flanked by inner sidewall spacers 225, 226, and inner sidewall spacers 227, 228 are provided at the gate electrode 209 of the second transistor element 260.

The offset spacers 219-222 and the inner sidewall spacers 225-228 may be comprised of a variety of materials, such as, for example, silicon nitride. The first liner layer 223 may also be comprised of a variety of materials, such as, for example, silicon dioxide.

Figure 1B:
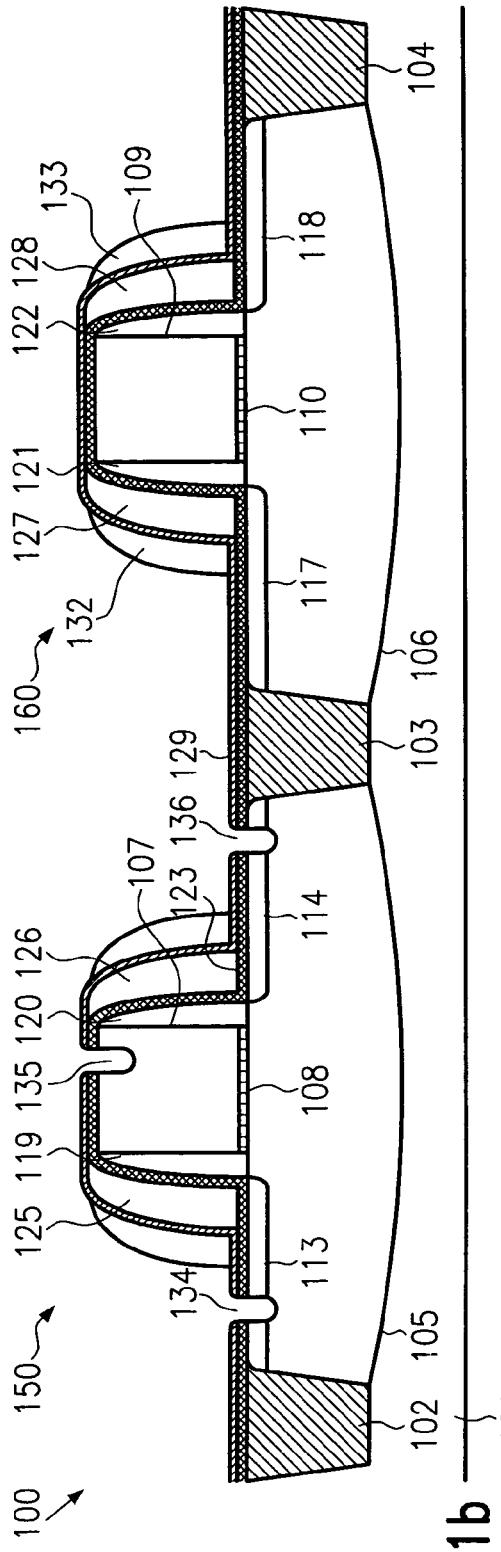
Figure 1C:
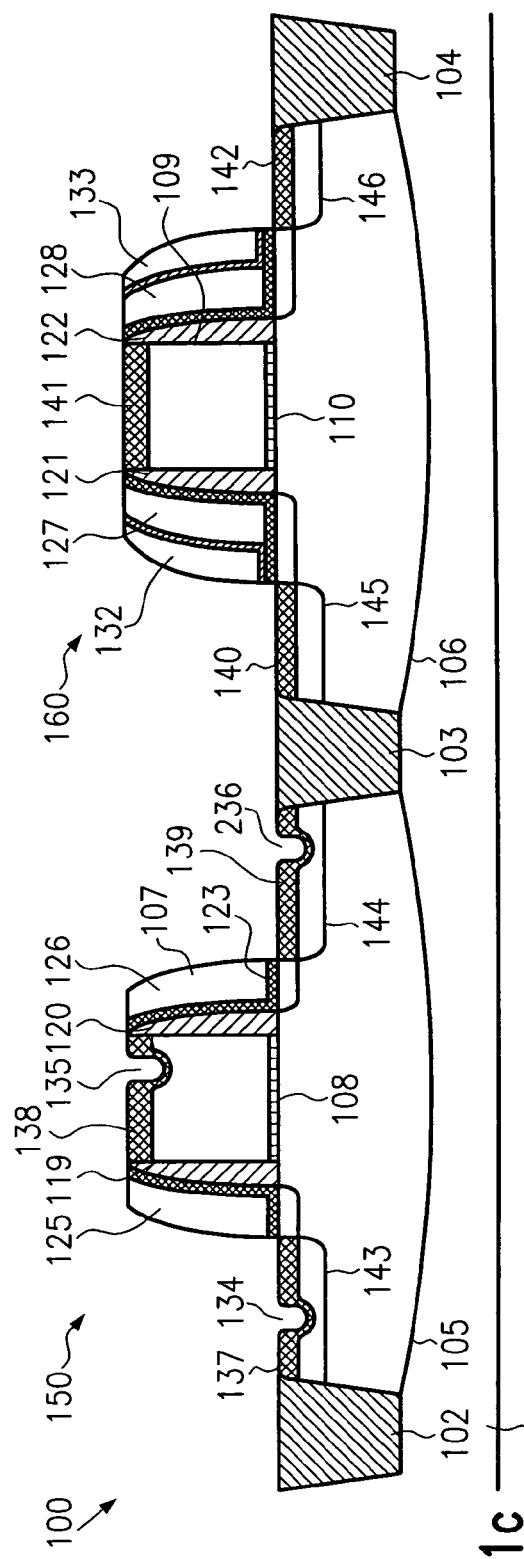

The semiconductor structure 200 can be formed by means of methods known to persons skilled in the art, as described above with reference to FIGS. 1a-1c.

A second liner layer 229 which may comprise silicon dioxide is formed over the substrate 201. Over the second liner layer 229, a material layer 230 is deposited. Both the second liner layer 229 and the material layer 230 can be deposited by known methods, such as chemical vapor deposition and plasma enhanced chemical vapor deposition.

The material layer 230 may be deposited conformally. In conformal deposition, a thickness of the deposited layer, measured in a direction perpendicular to the underlying deposition surface, is substantially independent of the inclination of the deposition surface. For example, a thickness of portions of the material layer 230 over side surfaces of the gate electrodes 207, 209 can be about the same as a thickness of portions of the material layer 230 located over horizontal portions of the semiconductor structure 100 such as a surface of the substrate 201 or the top surfaces of the gate electrodes 207, 209.

Figure 2B:
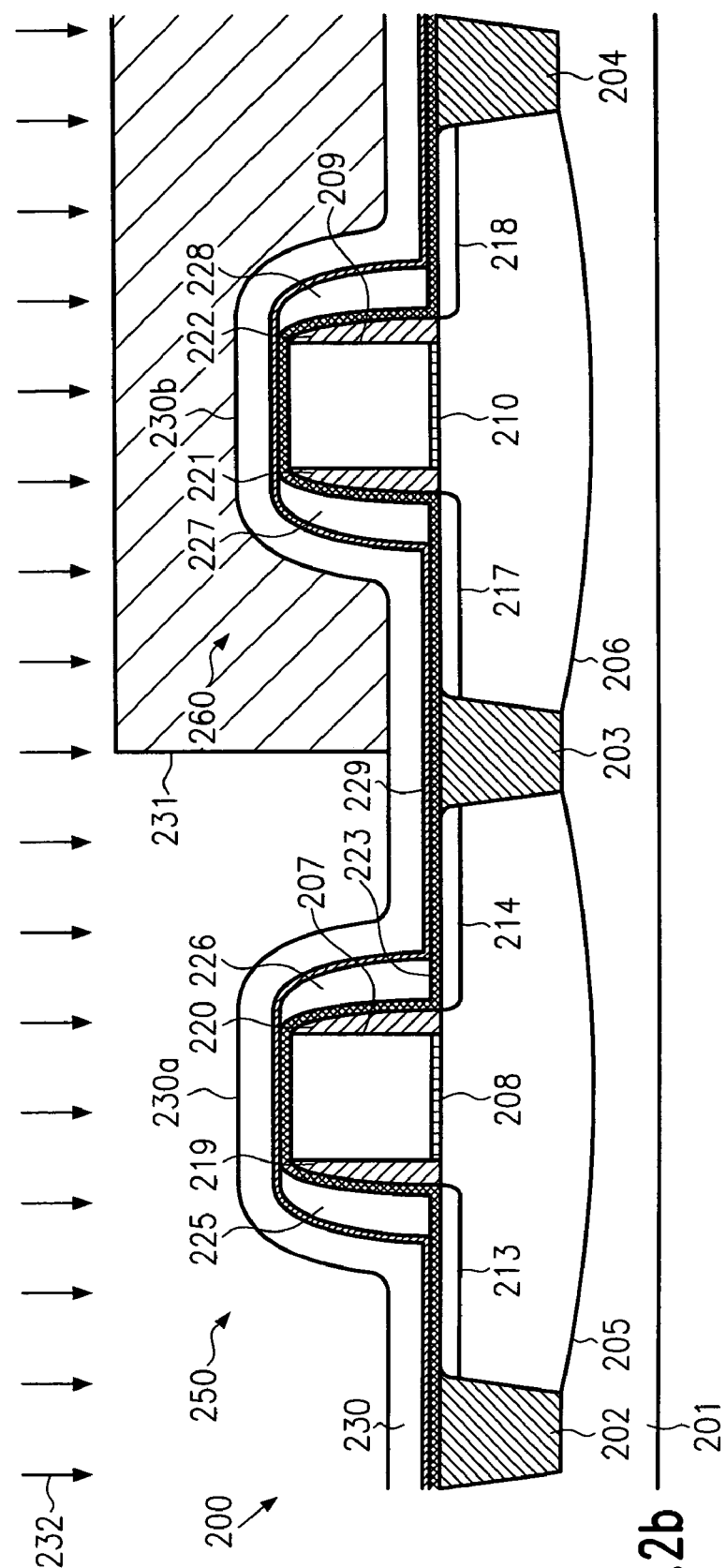

A schematic cross-sectional view of the semiconductor structure 200 in a later stage of the manufacturing process is shown in FIG. 2b. A mask 231 is formed over the second transistor element 260. The mask 231 may comprise a photoresist, and can be formed by means of photolithographic techniques known to persons skilled in the art.

Then, the semiconductor structure 200 is irradiated with ions, as indicated by arrows 232 in FIG. 2b. In particular embodiments of the present invention, the semiconductor structure 200 is irradiated with ions of a noble gas such as neon, argon, krypton, xenon, silicon or germanium. The ions may have an energy in a range from about 10 kV to about 150 kV. An ion dose used may be in a range from about $10^{14}$ ions/cm$^2$ to about $10^{16}$ ions/cm$^2$. Approximate implant parameters may readily be obtained by simulation.

Ions impinge on a first portion 230a of the material layer 230 located over the first transistor element 250 which is not covered by the mask 231. The ions penetrate into the material layer 230 and are decelerated inside the layer 230. Thereby, chemical bonds can be broken and atoms can be displaced from their positions. Thus, the chemical structure of the material in the first portion 230a of the material layer 230 can be modified.

The mask 231 absorbs ions impinging thereon. Consequently, a second portion 230b of the material layer 230 located over the second transistor element 260 is protected from being irradiated with ions and remains unmodified. Subsequently, the mask 231 is removed. If the mask 231 comprises a photoresist, this may be done by solving the mask 231 in a solvent.

FIG. 2c shows the semiconductor structure 200 in a later stage of the manufacturing process. An anisotropic etching process is performed, wherein the layer 230 is exposed to an etchant adapted to selectively remove the material of the layer 230, an etching rate of the material of the second liner layer 229 being significantly lower than an etching rate of the material of the layer 230.

The anisotropic etching process may comprise dry etching processes known as plasma etching, reactive ion etching or ion enhanced etching. In dry etching, a radio frequency glow discharge produces a chemically reactive species such as atoms, radicals and ions from a relatively inert molecular gas. The semiconductor structure 200 is exposed to the reactive species. The etching gas is selected such that a generated species reacts chemically with the material of the layer 230 to be etched, creating a volatile reaction product. The energy of ions impinging on the semiconductor structure 200 may be controlled by varying the frequency applied in creating the glow discharge and/or by applying a DC bias to the substrate 201. In general, a greater energy of the ions leads to a greater anisotropy of the etching process.

In an embodiment of the present invention wherein the layer 230 comprises silicon nitride and the second liner layer 229 comprises silicon dioxide, selective dry etching of the material of the layer 230 may be performed by means of an etching gas comprising a mixture of $CHF_3$ and $O_2$, $CH_2F_2$ and/or $CH_3F$.

Since, due to the irradiation of the first portion 230a of the layer 230 with ions, the chemical structure of the material in the first portion 230a is modified compared to that of the material in the second portion 230b, the first portion 230a is etched at a greater etching rate than the second portion 230b. Hence, the rate at which material is removed from the first portion 230a is greater than the rate at which material is removed from the second portion 230b, and the first portion 230a is removed more quickly than the second portion 230b.

The anisotropic etching is stopped upon a substantial removal of parts of the second portion 230b of the material layer 230 located over substantially horizontal portions of the second transistor element 260. Due to the anisotropy of the etching process, however, residues of the second portion 230b of the layer 230 located over steep portions of the second transistor element 260 remain on the semiconductor structure 200. In particular, residues of the material layer 230 are left adjacent the offset spacers 221, 222 and form outer sidewall spacers 235, 236.

Due to the greater etching rate of the first portion 230a of the material layer 230, the first portion 230a may be completely removed in the anisotropic etching. In other embodiments of the present invention, residues of the first portion 230a may remain on the flanks of the gate electrode 207. These residues comprise a smaller amount of material than the outer sidewall spacers 235, 236 of the second transistor element 260 and form outer sidewall spacers 233, 234 being smaller than the outer sidewall spacers 235, 236.

The difference between the etch rates of the first portion 230a and the second portion 230b of the layer 230 depends on the ion dose applied in the modification. The greater the ion dose, the more the chemical structure of the material in the first portion is modified compared to the unmodified material in the second portion 230b. Since the modification of the material entails a greater etching rate, the difference between the etching rates of the first and the second portion increases with the ion dose applied.

An appropriate value of the ion dose may be determined by means of experiments. To this end, material layers similar to the layer 230 may be deposited on a plurality of test structures similar to the semiconductor structure 200. A first portion of each of the material layers covers a first transistor element similar to the transistor element 250, and a second portion of each of the material layers covers a second transistor element similar to the transistor element 260. The first portion of each of the material layers is modified by irradiating the test structures with ions, whereas the second portions are protected by masks and, hence, remain substantially unmodified. Each of the test structures is exposed to a different ion dose. Then, the test structures are etched anisotropically. The etching is stopped upon a substantial removal of horizontal parts of the second portions of the material layers.

Subsequently, for each of the test structures, it is determined whether residues of the first portion of the material layer are present adjacent the gate electrode of the first transistor element. If residues of the first portion are present, their size can be measured. Thus, an ion dose adapted to yield a substantial removal of the residues of the first portion of the material layer or a desired size of the residues may be determined.

After the anisotropic etching, a source region 237 and a drain region 238 of the first transistor element 250 are formed in the active region 205. Similarly, a source region 239 and a drain region 240 of the second transistor element 260 are formed in the active region 206. The formation of the source regions 237, 239 and the drain regions 238, 240 may be performed by means of ion implantation.

In some embodiments of the present invention, the first transistor element 250 is an N-type transistor, and the second transistor element 260 is a P-type transistor. In such embodiments, the first transistor element 260 can be covered by a mask prior to an irradiation of the semiconductor structure 200 with ions of a P-type dopant such as, e.g., boron. Dopant ions are incorporated into portions of the active region 206 which thus become the source region 239 and the drain region 240. The mask protects the first transistor element 250 from being irradiated with ions.

The offset spacers 221, 222, the inner sidewall spacers 227, 228 and the outer sidewall spacers 235, 236 absorb ions impinging on the second transistor element 260. Portions of the active region under the offset spacers and sidewall spacers of the second transistor element 260 are protected from being irradiated with ions. Hence, the source region 239 and the drain region 240 are spaced apart from the side surfaces of the gate electrode 209 by a distance which depends on the thickness of the offset spacers 221, 222, the inner sidewall spacers 227, 228 and the outer sidewall spacers 235, 236.

The source region 239 and the extended source region 217 together form a source of the second transistor element 260. A drain of the second transistor element 260 is provided by the drain region 240 and the extended drain region 218.

The source region 237 and the drain region 238 of the first transistor element 250 may be formed by irradiating the semiconductor structure 200 with ions of an N-type dopant such as arsenic. The second transistor element 260 is protected from irradiation by means of a mask formed thereon. The ions are incorporated into portions of the active region 205 which are not protected by the offset spacers 219, 220 and the inner sidewall spacers 225, 226 and form the source region 237 and the drain region 238. If outer sidewall spacers 233, 234 are present in the first transistor element 250, the outer sidewall spacers 233, 234 also absorb ions impinging on the first transistor element 250. Hence, the source region 237 and the drain region 238 are spaced apart from the gate electrode 207 by a distance which is determined by the thickness of the offset spacers 219, 220, the inner sidewall spacers 225, 226 and, if outer sidewall spacers 233, 234 are present, the outer sidewall spacers 233, 234.

In other embodiments of the present invention, the first transistor element 250 may be a P-type transistor and the second transistor element 260 can be an N-type transistor. Alternatively, both transistor elements 250, 260 can be N-type transistors or P-type transistors. In such embodiments, the species of dopant ions implanted into the active regions 205, 206, the extended source regions 213, 217, the extended drain regions 214, 218, the source regions 237, 239 and the drain regions 240 may be adapted to the type of the transistor elements. If the first transistor element 250 and the second transistor element 260 are transistors of the same type, the source and drain regions in both transistor elements may be formed simultaneously in one implantation process.

Since the first transistor element 250 either does not comprise outer sidewall spacers or, if outer sidewall spacers 233, 234 are present, these outer sidewall spacers are thinner than the outer sidewall spacers 235, 236 of the second transistor element 260, the source and drain regions of the first transistor element 250 are closer to the gate electrode than the source and drain regions of the second transistor element 260.

Hence, the present invention allows providing different spacings between the source and drain regions and the gate electrode in different transistor elements without there being a need to perform an additional etching process to remove outer sidewall spacers from one of the transistor elements. Consequently, the second liner layer 229 is affected by etchant to a lesser extent than the second liner layer 129 used in the method according to the state of the art described above with reference to FIGS. 1a-1c.

A schematic cross-sectional view of the semiconductor structure 200 in yet another stage of the manufacturing process is shown in FIG. 2d. The outer sidewall spacers 233, 234, 235, 236 of the first transistor element 250 and the second transistor element 260 may be removed. This can be done by means of an etching process adapted to selectively remove the material of the layer 230, an etching rate of the material of the second liner layer 229 being significantly lower than an etching rate of the material of the layer 230. Since, in the method of the present invention, the second liner layer 229 has been affected by the etchant to a lesser extent than the second liner layer 129 used in the method according to the state of the art, the second liner layer 229 may be sufficient to substantially protect the rest of the semiconductor structure 200 from being affected by the etchant.

Then, the first liner layer 223 and the second liner layer 229 are removed, which may be done by means of an etching process, and metal silicide regions 241, 242, 243, 244, 245, 246 are formed in the source and the drain of the first transistor element 250 and the second transistor element 260, as well as in the gate electrodes 207, 209. As is well known to persons skilled in the art, this can be done by depositing a layer of a refractory metal and performing an annealing to initiate a chemical reaction between the metal and the silicon of the sources, drains and gate electrodes.

Since the outer sidewall spacers 235, 236 have been removed from the gate electrode 209, in the second transistor element 260 the spacing between the metal silicide regions 244, 246 and the gate electrode 209 is smaller than the spacing between the source regions 239, 240 and the gate electrode 209. The spacing between the metal silicide regions 244, 246 and the gate electrode 209 of the second transistor element 260 can be about the same as the spacing between the metal silicide regions 241, 243 and the gate electrode 207 of the first transistor element. Consequently, the conductivity of the source and the drain of the second transistor element can advantageously be made about the same as that of the source and the drain of the first transistor element 250, thus reducing undesirable signal propagation delays.

In other embodiments of the present invention, the outer sidewall spacers 233, 234, 235, 236 remain on the surface of the substrate 201. Consequently, the second liner layer 229 is exposed to etchant only in the anisotropic etching of the material layer 230. Thus, a pitting of the silicon in the source regions 237, 239, the drain regions 238, 240 and the gate electrodes 207, 209 can advantageously be avoided, thus improving yield and reliability of the manufacturing process.

Figure 3:
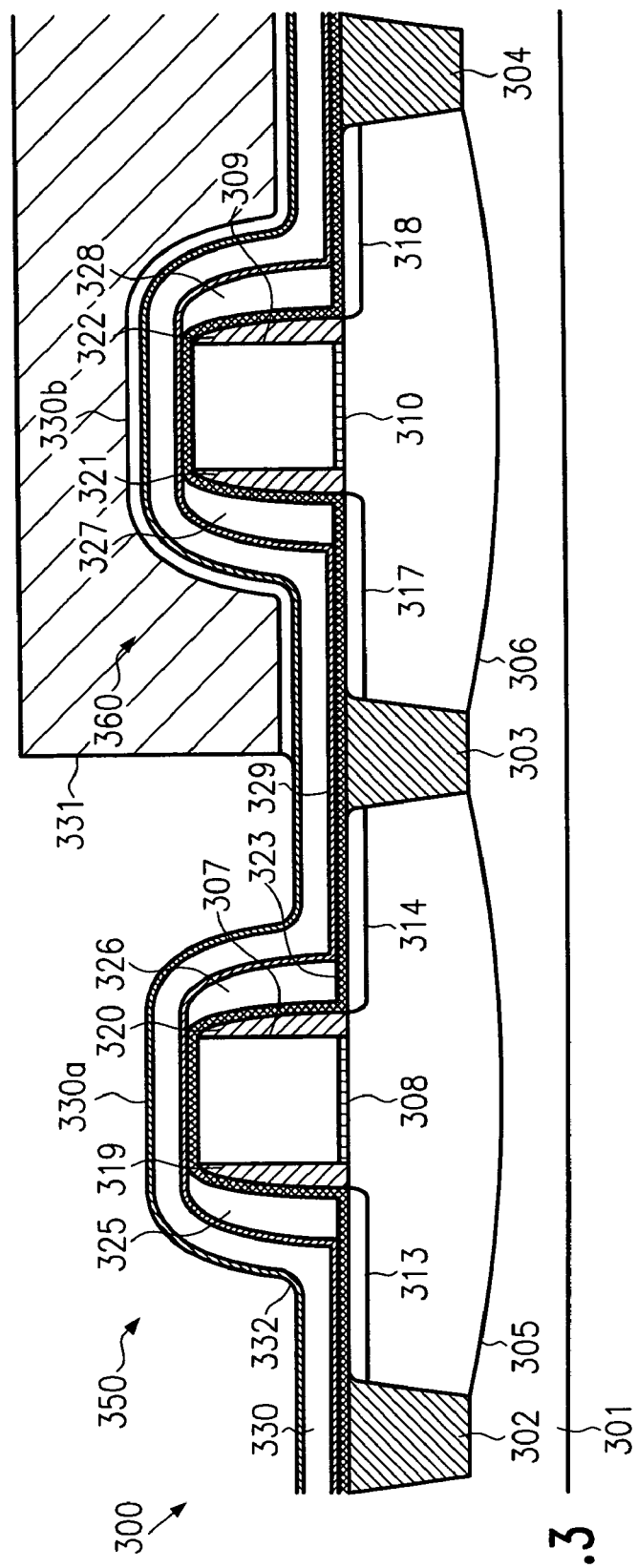
FIG. 3 shows a schematic cross-sectional view of a semiconductor structure in a stage of a manufacturing process according to another embodiment of the present invention.

A further embodiment of the present invention will be described with reference to FIG. 3. FIG. 3 shows a schematic cross-sectional view of a semiconductor structure 300 in a stage of a manufacturing process according to the present invention. Shallow trench isolations 302, 303, 304 separate active regions 305, 306 of a first transistor element 350 and a second transistor element 360 which are formed in a substrate 301. Gate insulation layers 308, 310 separate a gate electrode 307 of the first transistor element 350 and a gate electrode 309 of the second transistor element 360 from the active region 305 and the active region 306, respectively. An extended source region 313 and an extended drain region 314 are provided in the active region 305. Similarly, in the active region 306, an extended source region 317 and an extended drain region 318 are formed. Offset spacers 319, 320, 321, 322 are formed adjacent the gate electrodes 307, 309. A first liner layer 323 separates inner sidewall spacers 325, 326 from the gate electrode 307 of the first transistor element 350, and inner sidewall spacers 327, 328 from the gate electrode 309 of the second transistor element 360. These features may be formed by means of known methods, as described above with reference to FIGS. 1a-1c.

A second liner layer 329 and a material layer 330 are deposited on the semiconductor structure 300. This may be done by means of methods such as chemical vapor deposition and plasma enhanced chemical vapor deposition which are known to persons skilled in the art. The second liner layer 329 may comprise silicon dioxide, and the material layer 330 may comprise silicon nitride.

In some embodiments of the present invention, the material layer 330 may comprise an indicator layer 332 provided inside the material layer 330, the indicator layer 332 comprising an indicator material in addition to the material of the layer 330. No indicator material at all or only very small amounts of the indicator material are present in the rest of the material layer 330. In an embodiment of the present invention wherein the material layer 330 comprises silicon nitride, the indicator material may comprise carbon.

A mask 331 is formed over the second transistor element 360. The mask 331 can comprise a photoresist, and may be formed by means of photolithographic methods known to persons skilled in the art. The mask 331 does not cover a first portion 330a of the material layer 330 located over the first transistor element 360. A second portion 330b of the material layer 330 located over the second transistor element 350 is covered by the mask 331.

An isotropic etching process is performed. In isotropic etching, an etching rate of portions of the material layer 330 formed over substantially horizontal portions of the semiconductor structure 300 is about the same as the etching rate of inclined portions of the material layer 330. The isotropic etching process may comprise dry etching, as described above. The mask 331 protects the second portion 330b of the layer 330 located over the second transistor element 360 from being affected by an etchant used in the isotropic etching process.

In embodiments of the present invention wherein the material layer 330 comprises an indicator layer 332, an emission intensity representative of a chemical reaction between the indicator material and the etchant can be measured during the isotropic etching. This may be done by measuring an emission intensity of at least one spectral line emitted by a product of a chemical reaction between the etchant and the indicator material, which can be done by means of methods known to persons skilled in the art. The emission intensity is a measure for the concentration of the product, which is representative of the rate at which the chemical reaction occurs.

In an embodiment of the present invention wherein the material of the layer 330 comprises silicon nitride and the indicator material comprises carbon, the measurement of the emission intensity may comprise measuring the intensity of a spectral line of excited CN molecules.

In the initial phase of the etching process, a small emission intensity is measured since only portions of the material layer 330 other than the indicator layer 332 react with the etchant. As the material of the first portion 330a of the material layer 330 is removed and the surface of the layer 330 advances towards the semiconductor structure 300, the emission intensity remains small until the surface of the first portion 330a reaches the indicator layer 332. Then, the indicator material in the indicator layer 332 reacts with the etchant, which leads to an increase of the measured emission intensity.

The isotropic etching process is stopped prior to a complete removal of the portion 330a of the material layer 330. This may be done based on a detection of the increase of the emission intensity.

The detection of the increase of the emission intensity can be performed by comparing the measured emission intensity with a first threshold value. For example, the etching process may be stopped as soon as the emission intensity exceeds the first threshold value. A part of the first portion 330a of the layer 330 of material and a part of the indicator layer 332 located therein are not etched away and remain on the first transistor element 350.

In further embodiments of the present invention, a decrease of the emission intensity may be detected instead of an increase. If the etching process is continued after the exposure of the indicator layer 332, the measured emission intensity decreases to a very small value, since the portion of the indicator layer 332 located in the first portion 330a of the material layer 330 is completely removed.

The decrease in the emission intensity can be detected by comparing the emission intensity with a second threshold value, which is smaller than the maximum value of the emission intensity that occurs during the etching of the indicator layer 332. The etching process may then be stopped as soon as the emission intensity falls below the second threshold value. Advantageously, stopping the etching process upon the detection of a decrease in the emission intensity allows a substantial removal of the portion of the indicator layer 332 located in the first portion 330a of the material layer 330 such that potential adverse effects caused by the presence of the indicator material are minimized.

Values of the first and the second threshold value may be determined by performing a series of experiments. In each experiment, a transistor element covered by a layer of a material similar to the layer 330 and comprising an indicator layer or another suitable test structure is formed. Then, the transistor element is exposed to an etchant adapted to selectively remove the layer material. The etching process is stopped after a predetermined etching time. Different etching times are used in the individual experiments. After etching, the field effect transistors are investigated, for instance by means of microscopy, to determine the thickness of the material layer remaining on the field effect transistors and to determine whether the indicator layer is exposed. The results of the investigation of the field effect transistors are related to emission intensities measured immediately prior to the stopping of the etching processes to establish typical values of the emission intensity occurring during the etching of the indicator layers, which may be used as threshold values.

In other embodiments of the present invention, the isotropic etching process may be stopped after a predetermined etching time to remove a predetermined amount of material from the first portion 330a of the material layer 330 located over the first transistor element.

Advantageously, in the isotropic etching process, the second liner layer 329 is not affected by the etchant used, since a part of the layer 330 remains on the first transistor element 250 and prevents a contact between the etchant and the second liner layer 329.

After the isotropic etching process, the mask 331 is removed, and an anisotropic etching process, which may also comprise dry etching, is performed. Similar to the anisotropic etching process performed in the manufacturing process described above with reference to FIGS. 2a-2d, the anisotropic etching process is stopped upon a substantial removal of portions of the material layer 330 located over substantially horizontal portions of the second transistor element 360.

Due to the anisotropy of the etching process, residues of the second portion 330b of the material layer 330 located adjacent the inner sidewall spacers 327, 328 remain on the surface of the substrate 301 and form outer sidewall spacers (not shown) similar to the outer sidewall spacers 235, 236 shown in FIG. 2c.

In the isotropic etching process, the thickness of the first portion 330a of the layer 330 has been reduced. Therefore, the first portion 330a is removed more quickly in the anisotropic etching process than the second portion 330b. Hence, the first portion 330a may be completely removed in the anisotropic etching process. In other embodiments of the present invention, residues of the first portion 330a may remain on the surface of the semiconductor structure 301 and form outer sidewall spacers on the flanks of the gate electrode 307 of the first transistor element 350, which are smaller than the outer sidewall spacers at the gate electrode 309 of the second transistor element 360, similar to the outer sidewall spacers 233, 234 shown in FIG. 2c.

Similar to the embodiment of the present invention described above with reference to FIGS. 2a-2d, after the anisotropic etching, ion implantations may be performed to form source and drain regions in the active regions 305, 306. Afterwards, silicide regions similar to the silicide regions 241, 242, 243, 244, 245, 246 shown in FIG. 2d may be formed in the sources, the drains, and in the gate electrodes of the first transistor element 350 and the second transistor element 360.

Due to the absence of outer sidewall spacers at the gate electrode 307 of the first transistor element 350, or the smaller size of the outer sidewall spacers of the first transistor element 350 compared to those of the second transistor element 360, a distance between source and drain regions of the second transistor element 360 and the gate electrode 309 is greater than the distance between the source and drain regions of the first transistor element 350 and the gate electrode 307 thereof. Similar to the embodiments of the present invention described above with reference to FIGS. 2a-2d, there is no need to perform an additional etching process to remove the outer sidewall spacers of the first transistor element 350 subsequent to the formation of outer sidewall spacers.

The outer sidewall spacers in the second transistor element 360 and in the first transistor element 350 may be removed prior to the formation of the silicide region. Thus, the silicide regions in the source and the drain of the transistor elements 350, 360, in particular in the second transistor element 360, may be formed more closely to the gate electrodes 307, 309 than in a method according to the state of the art, thus advantageously reducing the resistance of the source and the drain.

In other embodiments of the present invention, the outer sidewall spacers may be left on the surface of the substrate 301. Thus, advantageously, a pitting of the silicon in the first transistor element 350 and the second transistor element 360 can be avoided.

The present invention is not restricted to embodiments wherein the first and the second transistor elements comprise offset spacers and inner sidewall spacers. In other embodiments of the present invention, spacer elements may be selectively formed adjacent the gate electrode of the second transistor element without there being offset spacers and/or inner sidewall spacers between the spacer elements and the gate electrode. To this end, a layer of a material is deposited over the first and the second transistor element. Then, similar to the embodiments of the present invention described above, a first portion of the layer is modified, which may be done by irradiating the first portion with ions, or by means of an isotropic etching process which is performed to selectively reduce a thickness of the first portion. Subsequently, an etching process adapted to remove the first portion of the layer of material more quickly than an unmodified second portion of the layer located over the second transistor element is performed, as described above.

In a method according to the present invention, the first transistor element and the second transistor element need not be located close to each other, as shown in FIGS. 2a-2d and 3. In other embodiments, the transistor elements may be provided in different regions of a substrate. In some embodiments, the substrate comprises a semiconductor wafer having a plurality of dies. In such embodiments, the first and the second transistor element can be provided on the same die, or may be provided on different dies.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a semiconductor structure, comprising:

provoding a substrate comprising a first transistor element and a second transistor element each having inner sidewall spacers having approximately the same width;

depositing a layer of a material over said first transistor element and said second transistor element and said inner sidewall spacers;

modifying a first portion of said layer of material located over said first transistor element;

performing an etching process, said etching process being adapted to remove said modified first portion of said layer of material at a greater etch rate than an unmodified second portion of said layer located over said second transistor element;

implanting ions of at least one dopant material into at least one of said first transistor element and said second transistor element after said etching process;

performing a second etching process adapted to remove residues of said layer of material; and forming a silicide region proximate said first and second transistor elements, the silicide region being spaced from said first and second transistor elements based on a width of said inner sidewall spacers.

2. The method of claim 1, wherein said modification of said first portion of said layer of material is performed by implanting ions.

3. The method of claim 2, further comprising forming a mask over said second transistor element, said formation of said mask being performed prior to said implantation of ions.

4. The method of claim 3, further comprising removing said mask after said implantation of ions.

5. The method of claim 1, wherein said etching process is anisotropic, and said etching process is stopped upon a substantial removal of portions of said layer of material located over substantially horizontal portions of said second transistor element.

6. The method of claim 1, further comprising forming a liner layer prior to said deposition of said layer of material.

7. The method of claim 1, wherein said layer of material comprises silicon nitride.

8. The method of claim 3, wherein said mask comprises a photoresist.

9. The method of claim 1, wherein said first transistor element is an N-type transistor and said second transistor element is a P-type transistor.

10. A method of forming a semiconductor structure, comprising:

providing a substrate comprising a first transistor element and a second transistor element, said first and second transistor elements include inner sidewall spacers, the inner sidewall spacers associated with the first transistor element having approximately the same width as the inner sidewall spacers associated with the second transistor element;

depositing a layer of a material over said first transistor element and said second transistor element and said inner sidewall spacers;

forming an indicator layer in said material;

forming a mask over said second transistor element;

performing an isotropic etching process, said isotropic etching process being stopped prior to a complete removal of a portion of said layer of material located over said first transistor element based upon detecting said indicator layer;

removing said mask; and performing an anisotropic etching process, said anisotropic etching process being stopped upon a substantial removal of portions of said layer of material located over substantially horizontal portions of said second transistor element;

implanting ions of at least one dopant material into at least one of said first transistor element and said second transistor element after said anisotropic etching process;

performing a third etching process adapted to remove residues of said layer of material; and forming suicide regions proximate said first and second transistor elements, the suicide regions being spaced from said first and second transistor elements based on a width of said inner sidewall spacers.

11. The method of claim 10, further comprising forming a liner layer prior to said deposition of said layer of material.

12. The method of claim 10, wherein said layer of material comprises silicon nitride.

13. The method of claim 10, wherein said mask comprises a photoresist.

14. The method of claim 10, wherein said first transistor element is an N-type transistor and said second transistor element is a P-type transistor.

15. The method of claim 10, wherein stopping said isotropic etching process comprises stopping said isotropic etch process responsive to detecting the etching of said indicator layer.

16. The method of claim 15, wherein detecting the etching of said indicator layer comprises detecting an increase in measured emission intensity associated with a material of the indicator layer.

17. The method of claim 10, wherein stopping said isotropic etching process comprises stopping said isotropic etch process responsive to detecting a removal of said indicator layer.

18. The method of claim 17, wherein detecting the etching of said indicator layer comprises detecting a decrease in measured emission intensity associated with a material of the indicator layer.

* * * * *